(12) United States Patent
Chen et al.

(10) Patent No.: US 9,374,896 B2
(45) Date of Patent: Jun. 21, 2016

(54) PACKAGING CARRIER AND MANUFACTURING METHOD THEREOF AND CHIP PACKAGE STRUCTURE

(71) Applicant: Unimicron Technology Corp., Taoyuan (TW)

(72) Inventors: Ming-Chih Chen, Hsinchu (TW); Dyi-Chung Hu, Hsinchu County (TW)

(73) Assignee: Unimicron Technology Corp., Taoyuan (TW)

( * ) Notice: Subject to any disclaimer, the term of this patent is extended or adjusted under 35 U.S.C. 154(b) by 54 days.

(21) Appl. No.: 14/038,769

(22) Filed: Sep. 27, 2013

(65) Prior Publication Data
US 2014/0102772 A1    Apr. 17, 2014

(30) Foreign Application Priority Data
Sep. 27, 2012 (TW) .............................. 101135573 A

(51) Int. Cl.
| | | |
|---|---|---|
| *H05K 1/16* | (2006.01) | |
| *H05K 1/11* | (2006.01) | |
| *H05K 3/40* | (2006.01) | |
| *H05K 3/46* | (2006.01) | |

(52) U.S. Cl.
CPC .............. *H05K 1/113* (2013.01); *H05K 3/4038* (2013.01); *H05K 3/4602* (2013.01); *H05K 2201/10378* (2013.01); *Y10T 29/49149* (2015.01)

(58) Field of Classification Search
CPC ..................... H05K 1/185; H05K 2201/10378
See application file for complete search history.

(56) References Cited

U.S. PATENT DOCUMENTS

| | | | | |
|---|---|---|---|---|
| 6,952,049 | B1 * | 10/2005 | Ogawa et al. ................. | 257/700 |
| 2006/0272853 | A1 * | 12/2006 | Muramatsu et al. .......... | 174/262 |
| 2009/0145636 | A1 * | 6/2009 | Miki et al. .................... | 174/255 |
| 2010/0025081 | A1 * | 2/2010 | Arai et al. ..................... | 174/251 |
| 2011/0063806 | A1 * | 3/2011 | Kariya et al. ................. | 361/748 |
| 2012/0234589 | A1 * | 9/2012 | Furuichi et al. ............... | 174/261 |

FOREIGN PATENT DOCUMENTS

| | | |
|---|---|---|
| JP | 2010239126 | 10/2010 |
| TW | 201007903 | 2/2010 |
| TW | 201104812 | 2/2011 |
| TW | 201110250 | 3/2011 |
| TW | 201121376 | 6/2011 |

(Continued)

OTHER PUBLICATIONS

"Office Action of Taiwan Counterpart Application", issued on Jan. 16, 2014, p. 1-p. 8.

(Continued)

*Primary Examiner* — Steven T Sawyer
(74) *Attorney, Agent, or Firm* — Jianq Chyun IP Office

(57) ABSTRACT

A packaging carrier includes an interposer, a dielectric layer and a built-up structure. The interposer has a first surface and a second surface opposite to each other, and a plurality of first pads and second pads located on the first surface and the second surface, respectively. The dielectric layer has a third surface and a fourth surface opposite to each other. The interposer is embedded in the dielectric layer. The second surface of the interposer is not covered by the fourth surface of the dielectric layer, and has a height difference with the fourth surface. The built-up structure is disposed on the third surface of the dielectric layer and electrically connected to the first pads of the interposer.

6 Claims, 8 Drawing Sheets

(56) References Cited

FOREIGN PATENT DOCUMENTS

| | | |
|---|---|---|
| TW | I358973 | 2/2012 |
| TW | 201209973 | 3/2012 |

OTHER PUBLICATIONS

"Office Action of Taiwan Counterpart Application", issued on Aug. 29, 2014, p. 1-p. 6.

\* cited by examiner

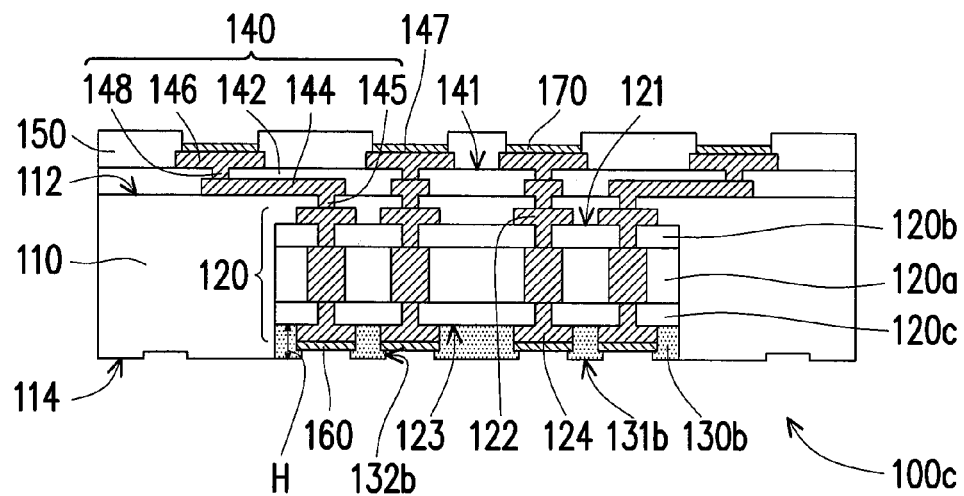
FIG. 8G'
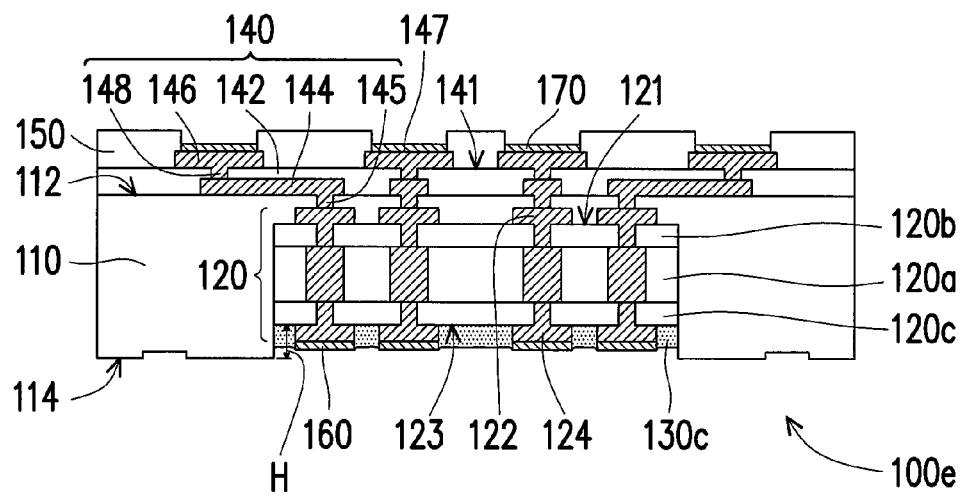
FIG. 8G"

PACKAGING CARRIER AND MANUFACTURING METHOD THEREOF AND CHIP PACKAGE STRUCTURE

CROSS-REFERENCE TO RELATED APPLICATION

This application claims the priority benefit of Taiwan application serial no. 101135573, filed on Sep. 27, 2012. The entirety of the above-mentioned patent application is hereby incorporated by reference herein and made a part of this specification.

BACKGROUND OF THE INVENTION

1. Field of the Invention

The invention relates to a carrier structure and a manufacturing method thereof and a package structure. More particularly, the invention relates to a packaging carrier and a manufacturing method thereof, and a chip package structure adopting the packaging carrier.

2. Description of Related Art

A purpose of a chip packaging is to protect an exposed chip, reduce contact density of the chip and provide good heat dissipation for the chip. The most common packaging method is to install a chip on a packaging carrier by wire bonding or flip chip bonding, such that contacts of the chip can be connected to the packaging carrier. Therefore, contact distribution of the chip can be rearranged through the packaging carrier so as to be fanned out and conform to an external component.

SUMMARY OF THE INVENTION

The invention provides a packaging carrier, suitable for carrying at least one chip.

The invention provides a chip package structure adopting the aforesaid packaging carrier and having a thinner package thickness.

The invention further provides a manufacturing method of a packaging carrier for manufacturing the aforesaid packaging carrier.

A packaging carrier of the invention includes a dielectric layer, an interposer and a built-up structure. The interposer has a first surface and a second surface opposite to each other, and a plurality of first pads and second pads located on the first surface and the second surface, respectively. The dielectric layer has a third surface and a fourth surface opposite to each other. The interposer is embedded in the dielectric layer. The second surface of the interposer is not covered by the fourth surface of the dielectric layer, and has a height difference with the fourth surface. The built-up structure is disposed on the third surface of the dielectric layer and electrically connected to the first pads of the interposer.

In an embodiment of the invention, the built-up structure includes a first circuit layer, at least an insulating layer, at least a second circuit layer, a plurality of first conductive vias and a plurality of second conductive vias. The first circuit layer is disposed on the third surface of the dielectric layer, and the first circuit layer is electrically connected to the first pad of the interposer through the first conductive via. The insulating layer covers the first circuit layer and the third surface of the dielectric layer. The second circuit layer is disposed on a surface of the insulating layer relatively away from the third surface. The second conductive via penetrates the insulating layer and electrically connects the first circuit layer and the second circuit layer.

In an embodiment of the invention, the interposer has a plurality of through vias, and each through via is filled with a conductive material so as to electrically connect the corresponding first pad and the corresponding second pad, and a material of the interposer includes silicon, glass or ceramic.

In an embodiment of the invention, the interposer includes a first interposer layer, a second interposer layer and a third interposer layer. The first interposer layer is located between the second interposer layer and the third interposer layer, and the second interposer layer and the third interposer layer have the first surface and the second surface, respectively, and a material of the first interposer layer includes silicon, glass or ceramic. When the material of the first interposer layer is silicon, materials of the second interposer layer and the third interposer layer are selected from insulation materials such as glass, ceramic, polyimide (PI), polybenzoxazole (PBO) fiber, bis-benzocyclobuten (BCB), silicones, acrylates or epoxy.

In an embodiment of the invention, the aforesaid packaging carrier further includes: an adhesive layer disposed on a second surface of an interposer, wherein the adhesive layer covers the second surface and exposes the second pads.

In an embodiment of the invention, the aforesaid packaging carrier further includes: an adhesive layer disposed on a second surface of an interposer, and having a plurality of first openings. The first openings expose the second pads of the interposer.

In an embodiment of the invention, the aforesaid adhesive layer further extends and is disposed on a fourth surface of a dielectric layer, and covers a fourth surface of the dielectric layer and a second surface of an interposer.

In an embodiment of the invention, the aforesaid adhesive layer is embedded in a dielectric layer and a bottom surface of the adhesive layer is aligned with a fourth surface of the dielectric layer.

A chip package structure of the invention includes the packaging carrier illustrated in the aforesaid embodiments, at least one chip and a plurality of solder balls. The chip is disposed on the packaging carrier. The solder balls are disposed on second pads of an interposer, wherein the chip is electrically connected with the second pads via the solder balls.

A manufacturing method of a packaging carrier of the invention includes the following steps. A metal substrate is provided. The interposer having an adhesive layer formed thereon is bonded to the metal substrate. The interposer has a first surface and a second surface opposite to each other, and a plurality of first pads and second pads located on the first surface and the second surface, respectively. The adhesive layer is formed on the second surface of the interposer and covers the second pads. A dielectric layer is laminated on the metal substrate and the first surface of the interposer. The dielectric layer encapsulates peripheries of the interposer and the adhesive layer. A built-up structure is formed on a third surface of the dielectric layer relatively away from the metal substrate. A metal substrate is removed to expose a fourth surface of the dielectric layer relative to the third surface. The second surface of the interposer is not covered by the fourth surface of the dielectric layer, and has a height difference with the fourth surface.

In an embodiment of the invention, the manufacturing method further includes: removing the adhesive layer completely to expose the second pads after removing the metal substrate.

In an embodiment of the invention, the manufacturing method further includes: removing a portion of the adhesive layer by forming openings to expose the second pads after removing the metal substrate.

In an embodiment of the invention, the manufacturing method of the packaging carrier further includes: removing a portion of the adhesive layer by reducing a thickness thereof after removing the metal substrate, wherein the adhesive layer covers the second surface and exposes the second pads.

In light of the above, since the adhesive layer of the invention is disposed on the dielectric layer and exposes the second pads of the interposer, such arrangement of the adhesive layer can be deemed as a passivation layer for protecting the second pads of the interposer from being damaged. Furthermore, since the interposer of the invention is embedded in the dielectric layer and the built-up structure is disposed on the dielectric layer, the packaging carrier of the invention has a thinner thickness and can also fan-out pad density of the interposer to further increase aspects of application for a product. In other words, the packaging carrier of the invention can be deemed as a packaging carrier with high layout density.

Several exemplary embodiments accompanied with figures are described in detail below to further describe the invention in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the invention.

DESCRIPTION OF EMBODIMENTS

Figure 1:
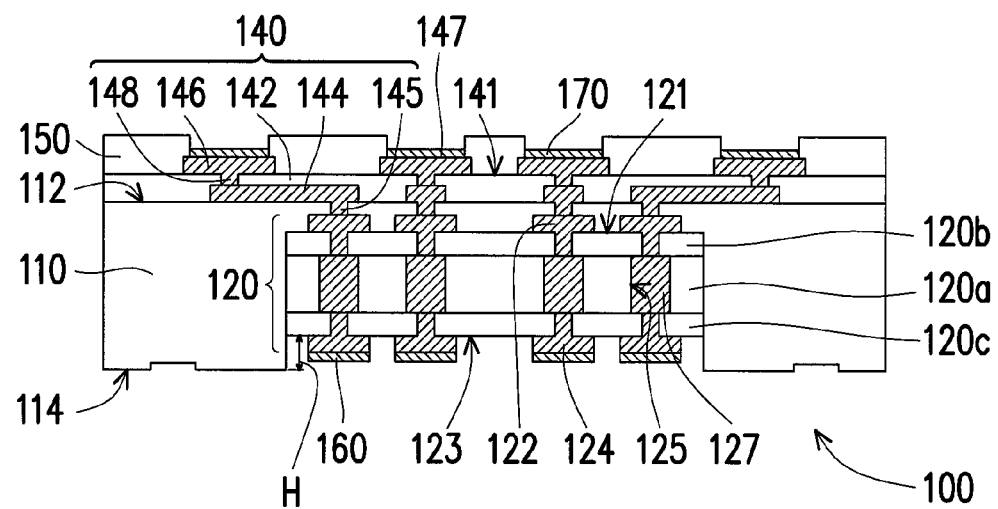
FIG. 1 illustrates a schematic cross-sectional view of a packaging carrier according to an embodiment of the invention.

FIG. 1 illustrates a schematic cross-sectional view of a packaging carrier according to an embodiment of the invention. Referring to FIG. 1, a packaging carrier 100 of the present embodiment includes a dielectric layer 110, an interposer 120, and a built-up structure 140. The interposer 120 has a first surface 121 and a second surface 123 opposite to each other, and a plurality of first pads 122 and second pads 124 located on the first surface 121 and the second surface 123, respectively. The dielectric layer 110 has a third surface 112 and a fourth surface 114 opposite to each other, and the interposer 120 is embedded in the dielectric layer 110. Specifically, the second surface 123 of the interposer 120 is not covered by the fourth surface 114 of the dielectric layer 110, and has a height difference H with the fourth surface 114. The built-up structure 140 is disposed on the third surface 112 of the dielectric layer 110 and electrically connected to the first pads 122 of the interposer 120.

More particularly, a material of the dielectric layer 110 of the present embodiment is, for example, ajinomoto build-up film (ABF) resin, benzocyclobutene (BCB) resin, a photoresist material (such as a material researched and developed by Shin-Etsu Chemical Co., Ltd. and abbreviated as SINR), polybenzoxazole (PBO), methyl-series silicone, ethyl-series silicone, cyclobenzene-series silicone, epoxy or other polymer resin.

In the present embodiment, the interposer 120 specifically includes a plurality of through vias 125, and each through via 125 is filled with a conductive material 127 and electrically connects the corresponding first pad 122 and the corresponding second pad 124. Here, the interposer 120 is composed of a first interposer layer 120a, a second interposer layer 120b and a third interposer layer 120c, wherein the first interposer layer 120a is located between the second interposer layer 120b and the third interposer layer 120c, and the second interposer layer 120b and the third interposer layer 120c have the first surface 121 and the second surface 123, respectively.

A material of the first interposer layer 120a includes silicon, glass or ceramic. When the material of the first interposer layer 120a is silicon, while materials of the second interposer layer 120b and the third interposer layer 120c are insulation materials such as glass or ceramic, a wall of the through via 125 also needs to be covered by insulation materials such as a layer of glass or ceramic to avoid electric conduction with the conductive material 127. Obviously, in other embodiments, the materials of the second interposer layer 120b and the third interposer layer 120c can also be selected from insulation materials such as polyimide (PI), polybenzoxazole (PBO) fiber, bis-benzocyclobuten (BCB), silicones, acrylates or epoxy. In other embodiments not illustrated herein, the interposer 120 can be a single substrate, and a material thereof includes silicon, glass or ceramic, but the invention is not limited thereto. Briefly, structures and types of the interposer in the present embodiment are not limited thereto. Two kinds of the interposer mentioned above are still the technical solutions adoptable by the invention and do not depart from the protection scope of the invention.

In addition, the built-up structure 140 of the present embodiment is, specifically, consisted of a first circuit layer 144, at least an insulating layer 142, at least a second circuit layer 146, a plurality of first conductive vias 145 and a plurality of second conductive vias 148. The first circuit layer 144 is disposed on the third surface 112 of the dielectric layer 110, and the first circuit layer 144 is electrically connected to the first pad 122 of the interposer 120 through the first conductive via 145. Here, an orthographic projection of a portion of the first circuit layer 144 on the third surface 112 of the dielectric layer 110 is not overlapped with an orthographic projection of the first pad 122 on the third surface 112 of the dielectric layer 110. In other words, the first circuit layer 144 and the second circuit layer 146 can fan out a contact of the first pad 122 of the interposer 120, such that a surface of the built-up structure 140 can have a bigger contact distributing area for bonding an external electronic device (not illustrated herein). The insulating layer 142 covers the first circuit layer 144 and the third surface 112 of the dielectric layer 110. The second circuit layer 146 is disposed on a surface 141 of the insulating layer 142 relatively away from the third surface 112. The second conductive via 148 penetrates the insulating layer 142 and electrically connects the first circuit layer 144 and the second circuit layer 146.

Moreover, the packaging carrier 100 of the present embodiment further includes a solder resist layer 150 disposed on the built-up structure 140, wherein the solder resist layer 150 exposes a portion of the built-up structure 140. Namely, the solder resist layer 150 exposes a portion of the outermost layer of the second circuit layer 146 of the built-up structure 140 so as to form a plurality of third pads 147. In order for the second pads 124 of the interposer 120 and the third pads 147 of the built-up structure 140 to have better contact reliability, the packaging carrier 100 of the present embodiment can further include a surface treatment layer 160 and a surface treatment layer 170. The surface treatment 160 is disposed on the second pads 124 of the interposer 120, and the surface treatment layer 170 is disposed on the third pads 147 of the build up structure 140, wherein the surface treatment layers 160 and 170 are configured to prevent the second pads 124 and the third pads 147 from oxidation or external contamination. Materials of the surface treatment layers 160 and 170 are, for example, nickel (Ni), palladium (Pd), gold (Au) and any alloy of a combination thereof, but are not limited herein.

Since the interposer 120 of the present embodiment is embedded in the dielectric layer 110 and the built-up structure 140 is disposed on the dielectric layer 110, the packaging carrier 100 of the present embodiment can be deemed as a packaging carrier with high layout density. Furthermore, since the height difference H exists between the second surface 123 of the interposer 120 and the fourth surface 114 of the dielectric layer 110 in the present embodiment, a packaging thickness of an overall chip package structure (not illustrated herein) can be reduced when the packaging carrier 100 of the present embodiment and a chip (not illustrated herein) are assembled later on to form a chip package structure.

It has to be noted that, the following embodiments use the reference numerals and a part of the content of the aforesaid embodiment, wherein same reference numerals are adopted to represent the same or similar elements, and repetitive explanations of the same technical content is omitted. Concerning the omitted illustrations, please refer to the aforesaid embodiment. The same technical content is not repeated in the following embodiments.

Figure 2:
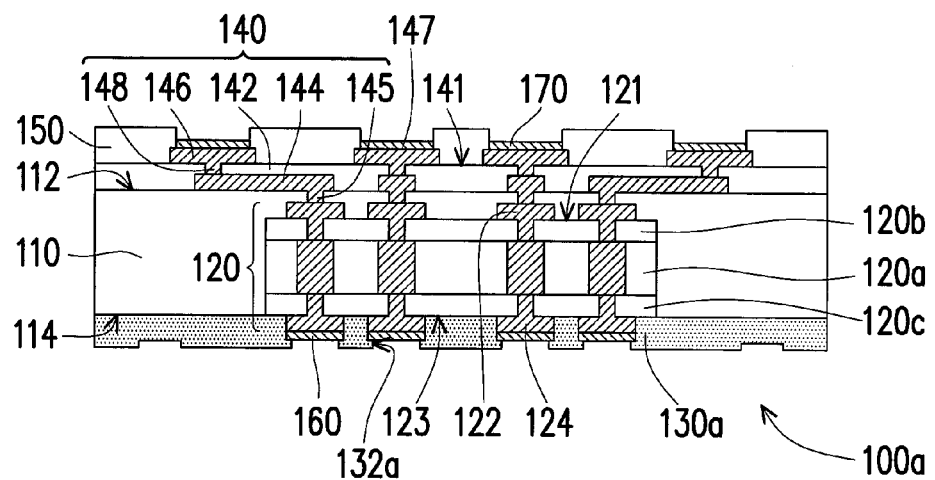
FIG. 2 illustrates a schematic cross-sectional view of a packaging carrier according to another embodiment of the invention.

FIG. 2 illustrates a schematic cross-sectional view of a packaging carrier according to another embodiment of the invention. Referring to FIG. 2, a packaging carrier 100a of the present embodiment is similar to the packaging carrier 100 of FIG. 1. The primary difference between the two packaging carriers lies in that: the packaging carrier 100a of the present embodiment further includes an adhesive layer 130a, wherein the adhesive layer 130a is disposed on the second surface 123 of the interposer 120 and has a plurality of first openings 132a, and the first openings 132a expose the second pads 124 of the interposer 120. More specifically, the adhesive layer 130a of the present embodiment further extends to the fourth surface 114 of the dielectric layer 110, wherein the adhesive layer 130a covers the fourth surface 114 of the dielectric layer 110 and the second surface 123 of the interposer 120. A material of the adhesion layer 130a is, for example, solder mask, resin or a viscous material. Here, the first openings 132a of the adhesive layer 130a expose the surface treatment layer 160 above the second pads 124, wherein a material of the surface treatment layer 160 is, for example, nickel (Ni), palladium (Pd), gold (Au) and any alloy of a combination thereof, but are not limited herein.

Since the adhesive layer 130a of the present embodiment is disposed on the second surface 123 of the interposer 120 and the fourth surface 114 of the dielectric layer 110 while exposing the second pads 124 of the interposer 120, such arrangement of the adhesive layer 130a can be deemed as a passivation layer for protecting the second pads 124 of the interposer 120 from being damaged. In addition, when the material of the adhesive layer 130a is, for example, solder mask, the adhesive layer 130a can also be deemed as a solder resist layer to avoid short circuits resulting from a subsequent solder (not illustrated herein) being mistakenly welded on the interposer 120. Furthermore, since the interposer 120 of the present embodiment is embedded in the dielectric layer 110 and the built-up structure 140 is disposed on the dielectric layer 110, the packaging carrier 100a of the present embodiment not only has a thinner thickness and can also fan-out pad density of the interposer 120 so as to further increase application aspects for a product. In other words, the packaging carrier 100a of the present embodiment can be deemed as a packaging carrier with high layout density.

Figure 3:
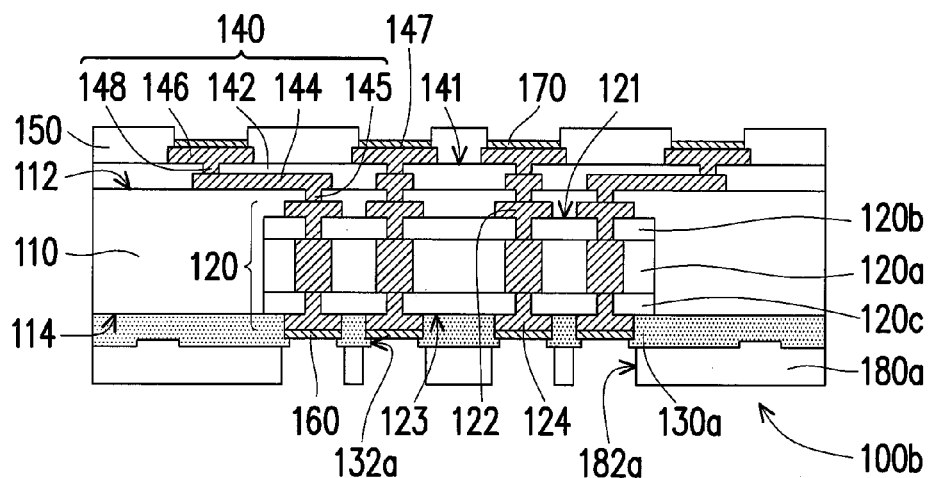
FIG. 3 illustrates a schematic cross-sectional view of a packaging carrier according to another embodiment of the invention.

FIG. 3 illustrates a schematic cross-sectional view of a packaging carrier according to another embodiment of the invention. Referring to FIG. 3, a packaging carrier 100b of the present embodiment is similar to the packaging carrier 100a of FIG. 2. The primary difference between the two packaging carriers lies in that: the packaging carrier 100b of the present embodiment further includes a solder resist layer 180a, wherein the solder resist layer 180a is disposed on the adhesive layer 130a. In the present embodiment, the solder resist layer 180a has a plurality of second openings 182a, and the second openings 182a respectively expose the first openings 132a of the adhesive layer 130a. Here, a diameter of the second openings 182a is substantially bigger than a diameter of the first openings 132a, and the second openings 182a also expose the surface treatment layer 160 located above the second pads 124 of the interposer 120. Therefore, in a subsequent application together with a process for bonding a chip (not illustrated herein), alignment tolerance between a solder ball (not illustrated herein) and the second opening 182a is bigger, and alignment accuracy is improved.

Figure 4:
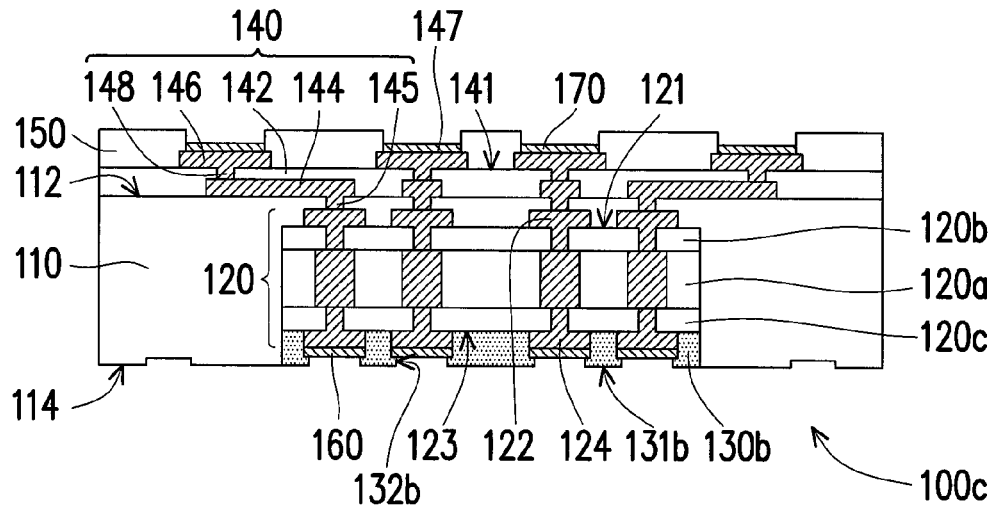
FIG. 4 illustrates a schematic cross-sectional view of a packaging carrier according to another embodiment of the invention.

FIG. 4 illustrates a schematic cross-sectional view of a packaging carrier according to another embodiment of the invention. Referring to FIG. 4, a packaging carrier 100c of the present embodiment is similar to the packaging carrier 100a of FIG. 2. The primary difference between the two packaging carriers lies in that: an adhesive layer 130b of the packaging carrier 100c of the present embodiment is embedded in the dielectric layer 110, and a bottom surface 131b of the adhesive layer 130b is substantially aligned with the fourth surface 114 of the dielectric layer 110, and first openings 132b of the adhesive layer 130b expose the surface treatment layer 160 located above the second pads 124 of the interposer 120. Namely, the adhesive layer 130b of the present embodiment does not extend to cover the fourth surface 114 of the dielectric layer 110.

Figure 5:
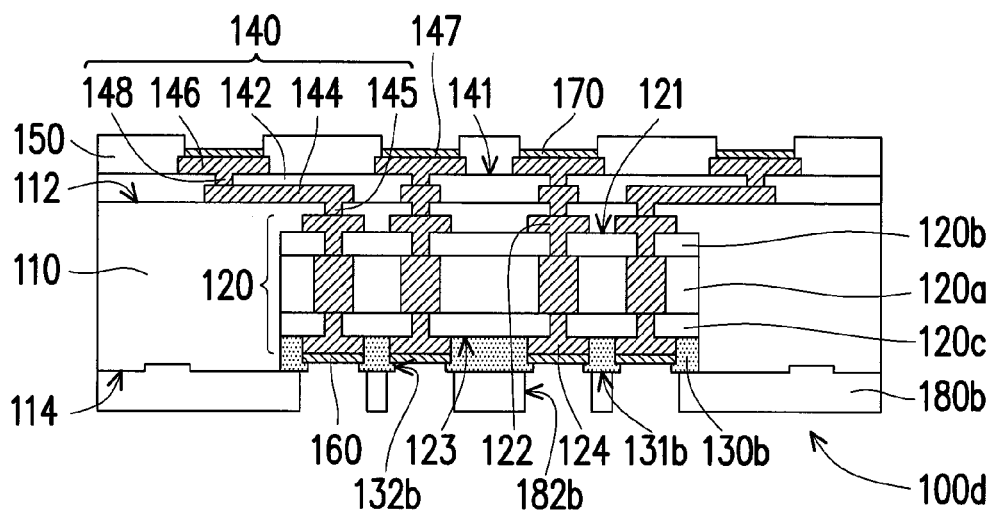
FIG. 5 illustrates a schematic cross-sectional view of a packaging carrier according to another embodiment of the invention.

FIG. 5 illustrates a schematic cross-sectional view of a packaging carrier according to another embodiment of the invention. Referring to FIG. 5, a packaging carrier 100d of the present embodiment is similar to the packaging carrier 100c of FIG. 4. The primary difference between the two packaging carriers lies in that: the packaging carrier 100d of the present embodiment further includes a solder resist layer 180b, wherein the solder resist layer 180b is disposed on the adhesive layer 130b and extends to cover the fourth surface 114 of the dielectric layer 110. In the present embodiment, the solder resist layer 180b has a plurality of second openings 182b, and the second openings 182b respectively expose the first openings 132b of the adhesive layer 130b. Here, a diameter of the second openings 182b is substantially bigger than a diameter of the first openings 132b, and the second openings 182b also expose the surface treatment layer 160 located above the second pads 124 of the interposer 120. Therefore, in a subsequent application together with a process for bonding a chip (not illustrated herein), alignment tolerance between a solder ball (not illustrated herein) and the second opening 182b is bigger, and alignment accuracy is improved.

Figure 6:
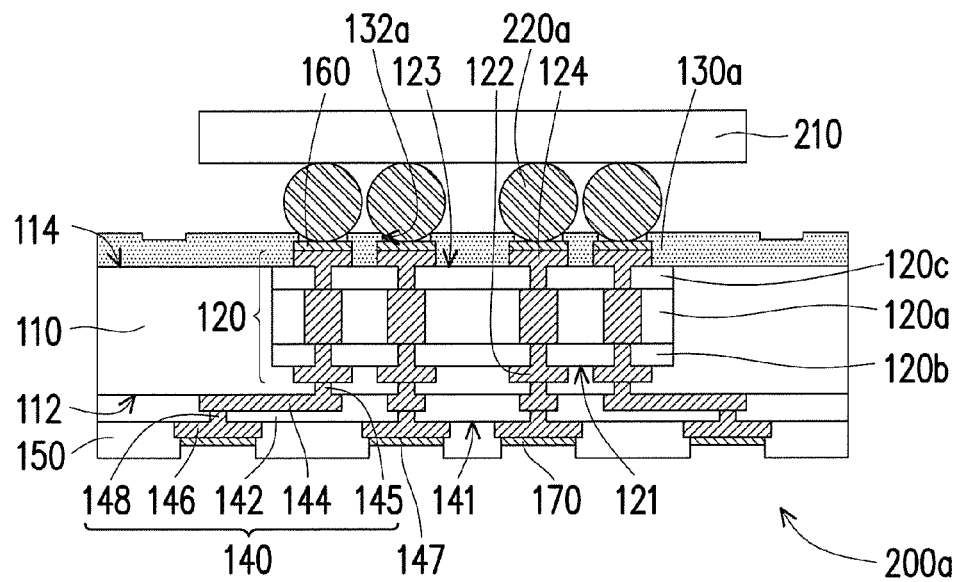
FIG. 6 illustrates a schematic cross-sectional view of a chip package structure according to an embodiment of the invention.

FIG. 6 illustrates a schematic cross-sectional view of a chip package structure according to an embodiment of the invention. Referring to FIG. 6, the chip package structure 200a of the present embodiment includes the packaging carrier 100a of FIG. 2, at least one chip 210 and a plurality of solder balls 220a. The chip 210 is disposed on the packaging carrier 100a. The solder balls 220a are disposed in the first openings 132a of the adhesive layer 130a, wherein the chip 210 is electrically connected to the surface treatment layer 160 located above the second pads 124 of the interposer 120 via the solder balls 220a. The chip 210 here can be an integrated circuit (IC) chip, such as a single chip like a graphic chip, a memory chip, a semiconductor chip, or a chip module; or a photoelectric chip, such as a light emitting diode (LED) chip or a laser diode chip. However, the invention is not limited thereto. Since a chip package structure 200a of the present embodiment adopts the packaging carrier 100a of FIG. 2, the chip package structure 200a of the present embodiment has a thinner package thickness and meets current trends for lightness, slimness, shortness and compactness.

Figure 7:
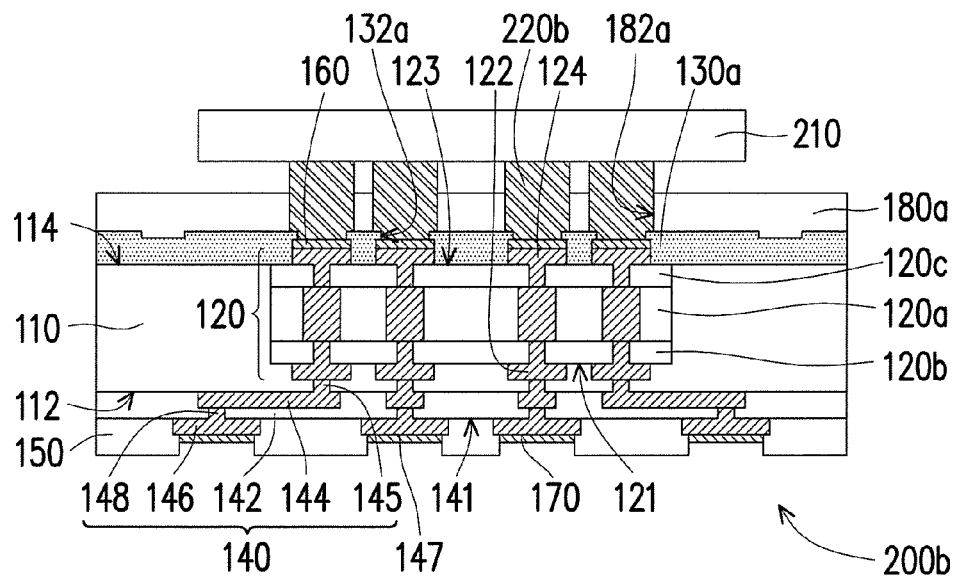
FIG. 7 illustrates a schematic cross-sectional view of a chip package structure according to another embodiment of the invention.

FIG. 7 illustrates a schematic cross-sectional view of a chip package structure according to another embodiment of the invention. Referring to FIG. 7, a chip package structure 200b of the present embodiment is similar to the chip package structure 200a of FIG. 6. The primary difference between the two structures lies in that: the packaging carrier of the present embodiment is the packaging carrier 100b having the solder resist layer 180a of FIG. 3. More particularly, the chip 210 is disposed on the packaging carrier 100b. Solder balls 220b are disposed in the second openings 182a of the solder resist layer 180a and the first openings 132a of the adhesive layer 130a, wherein the chip 210 is electrically connected to the surface treatment layer 160 located above the second pads 124 of the interposer 120 via the solder balls 220b. Here, a diameter of the second openings 182a is substantially bigger than a diameter of the first openings 132a, and the second openings 182a also expose the surface treatment layer 160 located above the second pads 124 of the interposer 120. Therefore, alignment tolerance between the solder ball 220b and the second opening 182a is bigger, and alignment accuracy is improved.

In addition, the adhesive layer 130a, the adhesive layer 130b embedded in the dielectric layer 110, and the solder resist layers 180a and 180b described in the aforesaid embodiments can also be selected for demonstrating other embodiments not illustrated herein. Those skilled in the art can select and match the aforesaid components based on their needs to achieve desired technical effects by referring to the descriptions of the aforesaid embodiments.

The structures of the packaging carrier of the invention is described above, while a manufacturing method of the packaging carrier is not yet introduced in the invention. With respect to this, descriptions will be provided by taking the structures of packaging carrier 100 of FIG. 1 and the packaging carrier 100c of FIG. 4 as examples hereinafter along with FIGS. 8A to 8G" to elaborate the manufacturing method of the packaging carriers 100, 100c and 100e of the invention.

Figure 8A:
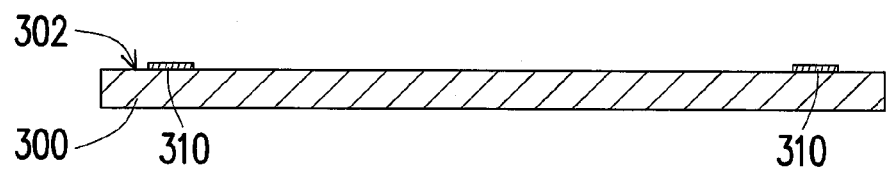
FIG. 8A to FIG. 8G" illustrate schematic cross-sectional views of a manufacturing method of a packaging carrier according to an embodiment of the invention.

FIG. 8A to FIG. 8G" illustrate schematic cross-sectional views of a manufacturing method of a packaging carrier according to an embodiment of the invention. Referring to FIG. 8A first, according to a manufacturing method of the packaging carrier 100 of the present embodiment, a metal substrate 300 having a plurality of positioning patterns 310 is provided at first. For instance, the positioning patterns 310 are formed by electroplating a metal with a patterned photoresist layer (not illustrated herein) as an electroplating mask, wherein the patterned photoresist layer is formed on a surface 302 of the metal substrate 300. Then, the patterned photoresist layer is removed after the positioning patterns 310 are formed, and the metal substrate 300 having the positioning patterns 310 as shown in FIG. 8A is formed.

Figure 8B:
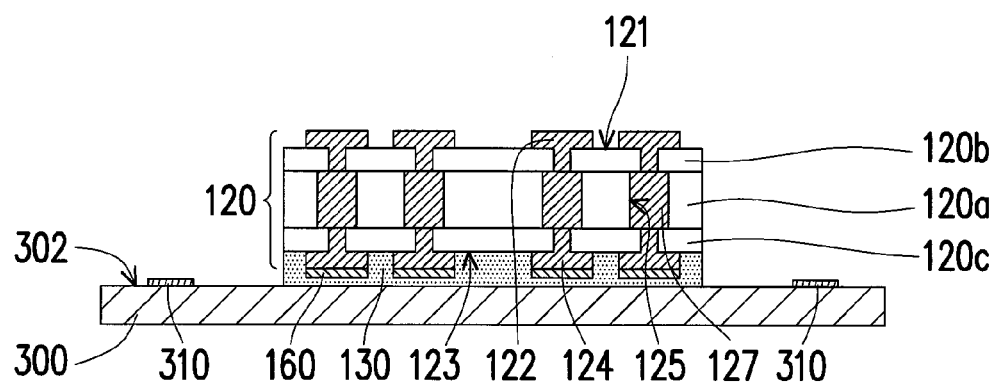

Next, referring to FIG. 8B, the interposer 120 having a formed adhesive layer 130 is bonded on the surface 302 of the metal substrate 300. The interposer 120 has the first surface 121 and the second surface 123 opposite to each other, and the plurality of first pads 122 and second pads 124 located on the first surface 121 and the second surface 123, respectively. The adhesive 130 is formed on the second surface 123 of the interposer 120 and covers the second pads 124. More specifically, in the present embodiment, the surface treatment layer 160 can be selectively formed above the second pads 124, and the adhesive layer 130 is formed on the second surface 123 of the interposer 120 and covers the second pads 124 or covers the surface treatment layer 160 located above the second pads 124, wherein the adhesive layer 130 completely encapsulates a periphery of the second pads 124 and a periphery of the surface treatment layer 160. The interposer 120 includes the plurality of through vias 125, and each through via 125 is filled with a conductive material 127 and electrically connects the corresponding first pad 122 and the corresponding second pad 124. Here, the interposer 120 is composed of the first interposer layer 120a, the second interposer layer 120b and the third interposer layer 120c, wherein the first interposer layer 120a is located between the second interposer layer 120b and the third interposer layer 120c, and the second interposer layer 120b and the third interposer layer 120c have the first surface 121 and the second surface 123, respectively. A material of the first interposer layer 120a includes silicon, glass or ceramic. When the material of the first interposer layer 120a is silicon, while materials of the second interposer layer 120b and the third interposer layer 120c are insulation materials such as glass or ceramic, walls of the through vias 125 also need to be covered by an insulation material such as a layer of glass or ceramic to avoid electric conduction with the conductive material 127. Obviously, in other embodiments, the materials of the second interposer layer 120b and the third interposer layer 120c can also be selected from insulation materials such as polyimide (PI), polybenzoxazole (PBO) fiber, bis-benzocyclobuten (BCB), silicones, acrylates or epoxy. In other embodiments not illustrated herein, the interposer 120 can be a single substrate layer, and a material thereof includes silicon, glass or ceramic, but the invention is not limited thereto. More specifically, the interposer 120 having a formed adhesive layer 130 is bonded on the metal surface 300 in a manner of lamination. The positioning patterns 310 of the present embodiment can be deemed as an alignment target. Since a size of the metal substrate 300 is greater than a size of the interposer 120, the interposer 120 can be positioned on the metal substrate 300 through the positioning patterns 310.

Figure 8C:
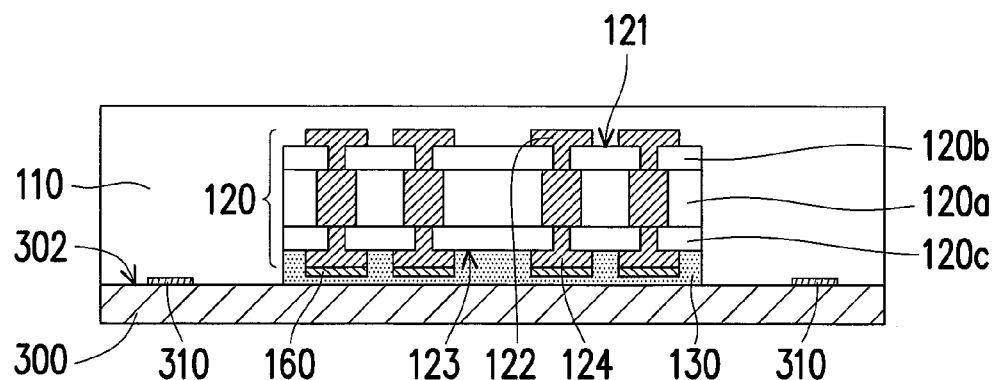

Next, referring to FIG. 8C, the dielectric layer 110 is laminated on the surface 302 of the metal substrate 300 and the first surface 121 of the interposer 120. Now, the dielectric layer 110 encapsulates peripheries of the interposer 120 and the adhesive layer 130, and the dielectric layer 110 covers the first surface 121 and the first pads 122 of the interposer 120.

Figure 8D:
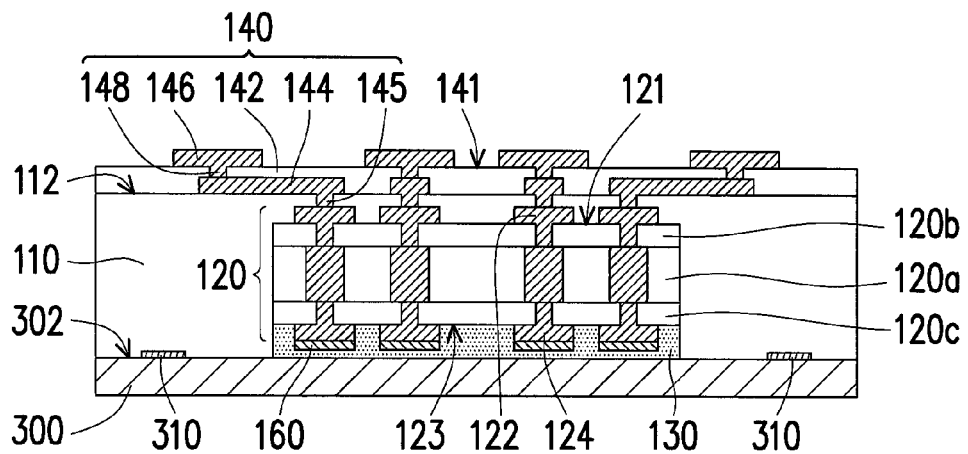

Next, referring to FIG. 8D, the built-up structure 140 is formed on the third surface 112 of the dielectric layer 110 relatively away from the metal substrate 300. More specifically, the built-up structure 140 of the present embodiment substantially is consisted of the first circuit layer 144, the at least insulating layer 142, the at least second circuit layer 146, the plurality of first conductive vias 145 and the plurality of second conductive vias 148. The first circuit layer 144 is formed on the third surface 112 of the dielectric layer 110, and the first circuit layer 144 is electrically connected to the first pad 122 of the interposer 120 through the first conductive via 145. Here, an orthographic projection of a portion of the first circuit layer 144 on the third surface 112 of the dielectric layer 110 is not overlapped with an orthographic projection of the first pad 122 on the third surface 112 of the dielectric layer 110. In other words, the first circuit layer 144 and the second circuit layer 146 can fan out a contact of the first pad 122 of the interposer 120, such that a surface of the built-up structure 140 can have a bigger contact distributing area for bonding an external electronic device (not illustrated herein). The insulating layer 142 covers the first circuit layer 144 and the third surface 112 of the dielectric layer 110. The second circuit layer 146 is disposed on a surface 141 of the insulating layer 142 relatively away from the third surface 112. The second conductive via 148 penetrates the insulating layer 142 and electrically connects the first circuit layer 144 and the second circuit layer 146.

Figure 8E:
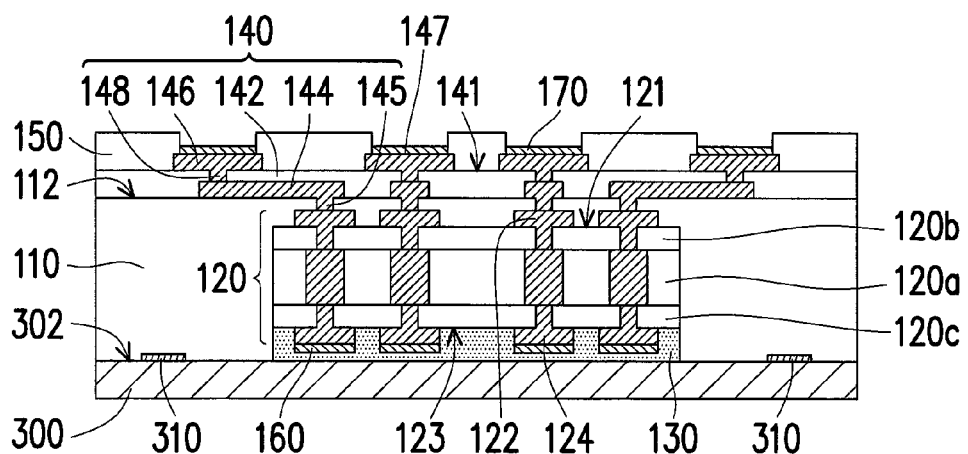

Next, referring to FIG. 8E, the solder resist layer 150 is formed on the built-up structure 140, wherein the solder resist layer 150 exposes a portion of the built-up structure 140. Namely, the solder resist layer 150 exposes a portion of the outermost layer of the second circuit layer 146 of the built-up structure 140 so as to form the plurality of third pads 147. In order for the third pads 147 to have better contact reliability, the surface treatment layer 170 can be formed on the third pads 147, so as to prevent the third pads 147 from being oxidized or external contamination.

Figure 8F:
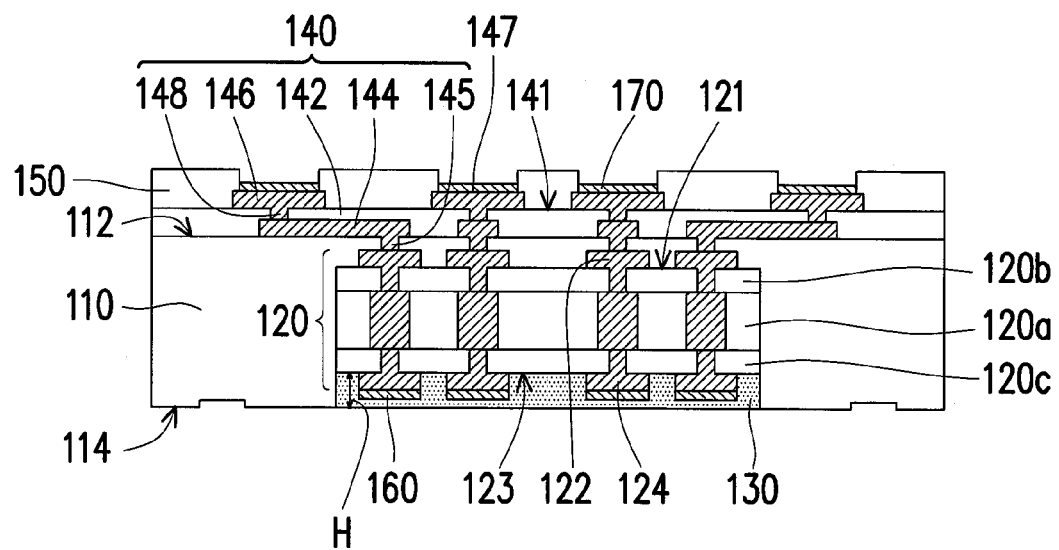

Then, referring to FIG. 8E and FIG. 8F, the metal substrate 300 is removed and the positioning patterns 310 can be selectively removed so as to expose the fourth surface 114 of the dielectric layer 110 relative to the third surface 112. Particularly, the fourth surface 114 of the dielectric layer 110 has a height difference H with the fourth surface 123 of the interposer 120.

Figure 8G:
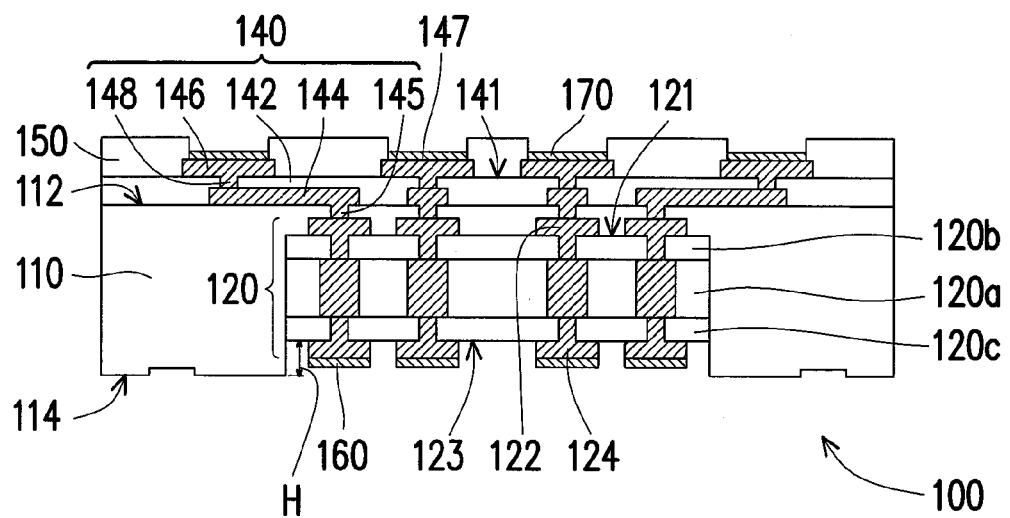

Lastly, referring to FIG. 8F and FIG. 8G together, the adhesive layer 130 is completely removed to expose the second pads 124 of the interposer 120 or expose the surface treatment layer 160 above the second pads 124. Now, a method of removing the adhesive layer 130 includes a plasma treatment, a blast cleaning, an etching treatment or a laser treatment, but the invention is not limited thereto. Thus, a manufacture of the packaging carrier 100 is completed.

In another embodiment, referring to FIG. 8G' after following steps illustrated in FIG. 8F, a portion of the adhesive layer 130 is removed by forming the first openings 132b. Thus, the adhesive layer 130b is formed by exposing portions of the second pads 124. Now, an arrangement of the adhesive layer 130b can be deemed as a passivation layer and/or a solder resist layer for protecting the second pads 124 of the interposer 120 from being damaged. Thus, a manufacture of the packaging carrier 100c is completed.

In another embodiment, referring to FIG. 8G" after following steps illustrated in FIG. 8F, a portion of the adhesive layer 130 is removed by reducing thickness of the adhesive layer 130. Thus, an adhesive layer 130c covering the second surface 123 of the interposer 120 and exposing the second pads 124 is formed. Here, the adhesive layer 130c substantially exposes the surface treatment layer 160 located above the second pads 124. Thus, a manufacture of the packaging carrier 100e is completed.

It is to be noted that solder balls (not illustrated herein) can also be disposed on the surface treatment layer 160 in a subsequent process, and a chip (not illustrated herein) can be electrically connected to the surface treatment layer 160 located above the second pads 124 of the interposer 120 via the solder balls so as to form a chip package structure (not illustrated herein). The chip here can be an integrated circuit (IC) chip, such as a single chip of a semiconductor chip like a central processor, a graphic processor and a memory; or a photoelectric processor, such as a light emitting diode (LED) chip or a laser diode chip. However, the invention is not limited thereto. Since the chip package structure adopts the packaging carriers 100, 100a, 100b, 100c, 100d and 100e of the present embodiment, the chip package structure has a thinner package thickness and meets current trends for lightness, slimness, shortness and compactness.

In summary, an arrangement of the adhesive layer of the invention can be deemed as a passivation layer and/or a solder resist layer for protecting the pads of the interposer from being damaged. Furthermore, since the interposer of the invention is embedded in the dielectric layer and the built-up structure is disposed on the dielectric layer, the packaging carrier of the invention has a thinner thickness and can also fan-out pad density of the interposer to further increase application aspects for a product. In other words, the packaging carrier of the invention can be deemed as a packaging carrier with high layout density. Moreover, a chip package structure adopting the packaging carrier of the invention has a thinner package thickness and meets current trends for lightness, slimness, shortness and compactness.

It will be apparent to those skilled in the art that various modifications and variations can be made to the structure of the disclosed embodiments without departing from the scope or spirit of the invention. In view of the foregoing, it is intended that the disclosure cover modifications and variations of this specification provided they fall within the scope of the following claims and their equivalents.

What is claimed is:

1. A packaging carrier, comprising: an interposer, having a first surface and a second surface opposite to each other, and a plurality of first pads and second pads located on the first surface and the second surface, respectively;

a dielectric layer, having a third surface and a fourth surface opposite to each other, wherein the interposer is embedded in the dielectric layer, the second surface of the interposer is not covered by the fourth surface of the dielectric layer and has a height difference with the fourth surface; and a built-up structure, disposed on the third surface of the dielectric layer and electrically connected to the first pads of the interposer, wherein the built-up structure only comprises a first circuit layer, at least an insulating layer, at least a second circuit layer, a plurality of first conductive vias and a plurality of second conductive vias, the first circuit layer is disposed on the third surface of the dielectric layer, and the first circuit layer is electrically connected to the first pads of the interposer through the first conductive vias, the insulating layer covers the first circuit layer and the third surface of the dielectric layer, the second circuit layer is disposed on a surface of the insulating lager relatively away from the third surface, the second conductive vias penetrate the insulating layer and electrically connect the first circuit layer and the second circuit layer, and the dielectric layer only covers a portion of the built-up structure by the third surface of the dielectric layer; wherein the interposer comprises a plurality of through vias, and each through via is filled with a conductive material and electrically connects the corresponding first pad and the corresponding second pad; and wherein the interposer comprises a first interposer layer, a second interposer layer and a third interposer layer, the first interposer layer is located between the second interposer layer and the third interposer layer, and the through vias at least comprises a plurality of first through vias passing through the first interposer layer and filled with the conductive material, two surfaces opposite to each other of the first interposer layer are aligned with two ends of each of the first through vias filled with the conductive material, and the second interposer layer and the third interposer layer respectively have the first surface and the second surface, and a material of the first interposer layer comprises silicon, glass or ceramic;

materials of the second interposer layer and the third interposer layer are selected from glass, ceramic, polyimide (PI), polybenzoxazole (PBO) fiber, bis-benzocyclobuten (BCB), silicones, acrylates or epoxy.

2. The packaging carrier as claimed in claim 1, further comprising:
an adhesive layer, disposed on the second surface of the interposer, wherein the adhesive layer covers the second surface and exposes the second pads.

3. The packaging carrier as claimed in claim 1, further comprising:
an adhesive layer, disposed on the second surface of the interposer and having a plurality of first openings, wherein the first openings expose the second pads of the interposer.

4. A chip package structure, comprising:
the packaging carrier as claimed in claim 1;
at least one chip, disposed on the packaging carrier; and
a plurality of solder balls, disposed on the second pads of the interposer, wherein the chip is electrically connected to the second pads via the solder balls.

5. The packaging carrier as claimed in claim 3, wherein the adhesive layer further extends and is disposed on the fourth surface of the dielectric layer, and covers the fourth surface of the dielectric layer and the second surface of the interposer.

6. The packaging carrier as claimed in claim 3, wherein the adhesive layer is embedded in the dielectric layer, and a bottom surface of the adhesive layer is aligned with the fourth surface of the dielectric layer.

* * * * *